United States Patent
Xi

(10) Patent No.: US 11,348,950 B2
(45) Date of Patent: May 31, 2022

(54) ARRAY SUBSTRATE AND DISPLAY PANEL

(71) Applicant: Shenzhen China Star Optoelectronics Semiconductor Display Technology Co., Ltd., Guangdong (CN)

(72) Inventor: Suping Xi, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 228 days.

(21) Appl. No.: 16/772,974

(22) PCT Filed: Apr. 24, 2020

(86) PCT No.: PCT/CN2020/086617
§ 371 (c)(1),
(2) Date: Jun. 15, 2020

(87) PCT Pub. No.: WO2021/196321
PCT Pub. Date: Oct. 7, 2021

(65) Prior Publication Data
US 2022/0130867 A1  Apr. 28, 2022

(30) Foreign Application Priority Data
Apr. 1, 2020  (CN) .......................... 202010252359.3

(51) Int. Cl.
*H01L 27/12* (2006.01)
*G02F 1/1362* (2006.01)

(52) U.S. Cl.
CPC ...... *H01L 27/124* (2013.01); *G02F 1/136204* (2013.01); *G02F 1/136227* (2013.01); *G02F 1/136277* (2013.01); *H01L 27/1225* (2013.01); *H01L 27/1255* (2013.01)

(58) Field of Classification Search
CPC .............. H01L 27/124; H01L 27/1225; H01L 27/1255; G02F 1/136204; G02F 1/136227; G02F 1/136277
USPC .................................................. 349/40, 192
See application file for complete search history.

(56) References Cited

U.S. PATENT DOCUMENTS

| 9,952,468 B2 * | 4/2018 | Cao .................. G02F 1/133753 |
| 2007/0000971 A1 | 1/2007 | Kumagai |
| 2009/0310051 A1 | 12/2009 | Kim |

(Continued)

FOREIGN PATENT DOCUMENTS

| CN | 101604103 A | 12/2009 |
| CN | 104090436 A | 10/2014 |

(Continued)

*Primary Examiner* — Charles S Chang

(57) ABSTRACT

An array substrate and a display panel are provided. The present disclosure can form a capacitor by having a first metal layer which forms a start pulse signal line to be a first plate, and having a second metal layer which is connected to a peripheral common electrode line to be a second plate, thereby achieving electrostatic protection. In addition, by designing the start pulse signal line from an original wire-wound type to a grid shape, accumulated electric charges accumulated in the start pulse signal line can be effectively eliminated, thereby reducing probability of electrostatic discharge in the start pulse signal line.

17 Claims, 3 Drawing Sheets

(56) References Cited

U.S. PATENT DOCUMENTS

| | | | |
|---|---|---|---|
| 2015/0380349 A1* | 12/2015 | Yan | H01L 27/124 |
| | | | 257/532 |
| 2019/0067218 A1* | 2/2019 | Lin | G02F 1/136204 |
| 2021/0366427 A1* | 11/2021 | Xi | H01L 27/1251 |

FOREIGN PATENT DOCUMENTS

| | | |
|---|---|---|
| CN | 205450520 U | 8/2016 |
| JP | 2007065615 A | 3/2007 |

* cited by examiner

ARRAY SUBSTRATE AND DISPLAY PANEL

FIELD OF INVENTION

The present disclosure relates to the field of display panel technologies, and more particularly, to an array substrate and a display panel.

BACKGROUND OF INVENTION

A gate driver on array, referred to as a GOA, is a gate line scanning and driving signal circuit fabricated on an array substrate by an array process of a current thin film transistor liquid crystal display to realize a driving method of scanning a gate line-by-line.

In a GOA driver circuit, since there are a large number of signal lines densely arranged and effects of direct current (DC) signals and alternating current (AC) signals, electric charges are easily generated and accumulated. When the electric charges are accumulated to a certain degree, a great electrical potential difference will be generated, which makes the accumulated electric charges have enough energy to leave an original position to neutralize electric charges with an opposite polarity, thereby generating a great electric current and even having a risk of blast and injury, causing display panels to be abnormal.

Electrostatic accumulation and discharge are among main factors that cause devices to be damaged in the semiconductor field. Electrostatic discharge (ESD) protection circuits are used to effectively block or evacuate static electricity, and prevent the devices from being damaged by the static electricity. Rationality of an ESD design is a key factor in whether it can better block or evacuate static electricity.

In view of this, how to use an effective wiring design to make a start pulse signal line (referred to as STV) have an anti-static ability to allow the display panels to have an electrostatic discharge protection ability is an important research topic for relevant developers and researchers.

Technical problem: an embodiment of the present disclosure provides an array substrate and a display panel. A capacitor is formed by having a first metal layer which forms a start pulse signal line to be a first plate and having a second metal layer which is connected to a peripheral common electrode line to be a second plate, thereby greatly improving a discharging rate of electric charges and achieving electrostatic protection. In addition, by designing the start pulse signal line from an original wire-wound type to a grid shape, current conductive channels of the start pulse signal line can be increased, and accumulated electric charges accumulated in the start pulse signal line can be effectively eliminated, which plays a role of dispersing the electric charges, thereby reducing probability of electrostatic discharge in the start pulse signal line.

SUMMARY OF INVENTION

According to one aspect of the present disclosure, an array substrate is provided. The array substrate includes a display area and a non-display area disposed surrounding the display area. Wherein, the non-display area includes: a gate driver on array (GOA) driver circuit, a start pulse signal line connected to the GOA driver circuit, and a peripheral common electrode line insulated from the start pulse signal line, wherein the non-display area further comprises a first metal layer used to form the start pulse signal line and the peripheral common electrode line; and a second metal layer connected to the peripheral common electrode line, wherein a projection of the start pulse signal line on the array substrate at least partially overlaps a projection of the second metal layer on the array substrate to form a capacitor between the second metal layer and the start pulse signal line, the capacitor is used to release electric charges accumulated in the GOA driver circuit, the start pulse signal line is a first plate of the capacitor, the second metal layer is a second plate of the capacitor, a gate electrode insulating layer disposed on the first metal layer is a dielectric insulating layer of the capacitor, and the first metal layer is a patterned metal layer having a grid shape under a top viewing angle.

In some embodiments of the present disclosure, a gate electrode insulating layer, an active layer, a passivation layer, and a conductive layer are disposed on the first metal layer in sequence, and the conductive layer is connected to the second metal layer through a first through-hole defined on the array substrate and penetrating through the passivation layer.

In some embodiments of the present disclosure, the conductive layer is connected to the first metal layer forming the peripheral common electrode line through a second through-hole defined on the array substrate and penetrating through the passivation layer, the active layer, and the gate electrode insulating layer in sequence.

In some embodiments of the present disclosure, the grid shape has equal intervals.

In some embodiments of the present disclosure, a material of the conductive layer is indium tin oxide.

In some embodiments of the present disclosure, a doped layer is further disposed between the active layer and the second metal layer.

In some embodiments of the present disclosure, the array substrate is an amorphous silicon array substrate or an indium gallium zinc oxide array substrate.

According to another aspect of the present disclosure, an array substrate is provided. The array substrate includes a display area and a non-display area disposed surrounding the display area. Wherein, the non-display area includes: a gate driver on array (GOA) driver circuit, a start pulse signal line connected to the GOA driver circuit, and a peripheral common electrode line insulated from the start pulse signal line, wherein the non-display area further comprises a first metal layer used to form the start pulse signal line and the peripheral common electrode line; and a second metal layer connected to the peripheral common electrode line, wherein a projection of the start pulse signal line on the array substrate at least partially overlaps a projection of the second metal layer on the array substrate to form a capacitor between the second metal layer and the start pulse signal line, and the capacitor is used to release electric charges accumulated in the GOA driver circuit.

Based on the above technical solutions, the technical content of the present disclosure can be improved as follows.

In some embodiments of the present disclosure, the start pulse signal line is a first plate of the capacitor, the second metal layer is a second plate of the capacitor, and a gate electrode insulating layer disposed on the first metal layer is a dielectric insulating layer of the capacitor.

In some embodiments of the present disclosure, a gate electrode insulating layer, an active layer, a passivation layer, and a conductive layer are disposed on the first metal layer in sequence, and the conductive layer is connected to the second metal layer through a first through-hole defined on the array substrate and penetrating through the passivation layer.

In some embodiments of the present disclosure, the conductive layer is connected to the first metal layer forming the peripheral common electrode line through a second through-hole defined on the array substrate and penetrating through the passivation layer, the active layer, and the gate electrode insulating layer in sequence.

In some embodiments of the present disclosure, the first metal layer is a patterned metal layer having a grid shape under a top viewing angle.

In some embodiments of the present disclosure, the grid shape has equal intervals.

In some embodiments of the present disclosure, a material of the conductive layer is indium tin oxide.

In some embodiments of the present disclosure, a doped layer is further disposed between the active layer and the second metal layer.

In some embodiments of the present disclosure, the array substrate is an amorphous silicon array substrate or an indium gallium zinc oxide array substrate.

According to yet another aspect of the present disclosure, a display panel is provided, which includes the above array substrate.

Beneficial effect: the beneficial effect of the present disclosure is that an embodiment of the present disclosure provides an array substrate and a display panel. A GOA driver circuit forms a capacitor by having a first metal layer which forms a start pulse signal line to be a first plate and having a second metal layer which is connected to a peripheral common electrode line to be a second plate, thereby greatly improving a discharging rate of electric charges and achieving electrostatic protection. In addition, by designing the start pulse signal line from an original wire-wound type to a grid shape, current conductive channels of the start pulse signal line can be increased, and accumulated electric charges accumulated in the start pulse signal line can be effectively eliminated, which plays a role of dispersing the electric charges, thereby reducing probability of electrostatic discharge in the start pulse signal line. Furthermore, through a reasonable wiring design and without changing original functions, the present disclosure can effectively improve an anti-static ability of the start pulse signal line.

DESCRIPTION OF DRAWINGS

The following detailed description of specific embodiments of the present disclosure will make the technical solutions and beneficial effects of the present disclosure obvious with reference to the accompanying drawings.

DETAILED DESCRIPTION OF PREFERRED EMBODIMENTS

Figure 1:
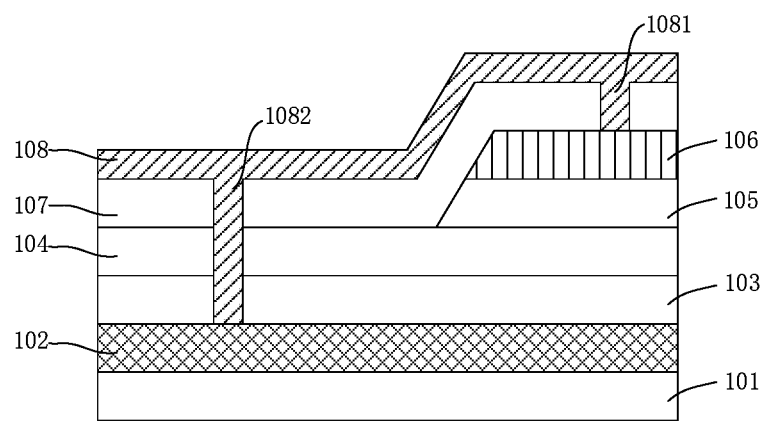
FIG. 1 is a schematic structural diagram of an array substrate according to an embodiment of the present disclosure.

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure.

The terms "first", "second", "third", etc. (if present) in the specification, claims of the present disclosure, and the drawings are used to distinguish similar objects, and are not necessarily used to describe in a particular order or prioritization. It should be understood that the objects so described may be interchanged where appropriate. In addition, the term "comprises", "have", and their variations are intended to cover a non-exclusive inclusion.

In the specific embodiments, the drawings discussed below and the embodiments used to describe the principles disclosed in the present disclosure are for illustration only, and should not be construed as limiting the scope of the present disclosure. Those skilled in the art will understand that the principles of the present disclosure may be implemented in any suitably arranged system. Exemplary embodiments will be explained in detail, and examples of these embodiments are shown in the drawings. In addition, embodiments of the present disclosure will be described in detail herein with reference to the accompanying drawings. The same reference numerals represent the same components.

The terms used in this specific embodiment are only used to describe specific embodiments, and are not intended to show the concept of the present disclosure. Unless there are clearly different meanings in the context, expressions used in the singular form include expressions in the plural form. In the specification of this disclosure, it should be understood that terms such as "include", "have", and "comprise" are intended to illustrate the possibility of the existence of features, numbers, steps, actions, or combinations thereof disclosed in the specification of this disclosure, and are not intended to exclude the possibility that one or more other features, numbers, steps, actions, or combinations thereof may be present or added. The same reference numerals represent the same parts.

As shown in FIG. 1, the present disclosure provides an array substrate. The array substrate may be but is not limited to an amorphous silicon array substrate or an indium gallium zinc oxide array substrate. The array substrate includes a glass substrate 101, a first metal layer 102, a gate electrode insulating layer 103, an active layer 104, a doped layer 105, a second metal layer 106, a passivation layer 107, a conductive layer 108, a first through-hole 1081, and a second through-hole 1082.

In the embodiment, the glass substrate is used as a base substrate, but it is not limited to this, other substrate materials can also be used, such as flexible plastics.

The first metal layer 102 is disposed on the glass substrate 101. A material of the first metal layer 102 may be Al, Ag, Cu, Mo, Cr, W, Ta, Ti, metal nitride, or alloys of any combinations of the above, and may also be a multi-layered structure having a heat-resistant metal film and a low resistivity film. In the embodiment, the material of the first metal layer 102 is copper (Cu).

The first metal layer 102 is used to form gate electrode wirings and GOA signal wirings. Further, the first metal layer 102 is also used to form a start pulse signal line 2022 and a peripheral common electrode line 2021, referring to FIG. 2.

The gate electrode insulating layer 103 is disposed on the first metal layer 102. The gate electrode insulating layer uses silicon nitride (SiNx) or silicon oxide, but it is not limited to this, at least one of silicon oxynitride, aluminum oxide, and aluminum nitride may be used. The gate electrode insulating layer 103 is used to prevent the active layer 104 from being in contact with the gate electrode wirings and having short circuits.

The active layer 104 is disposed on the gate electrode insulating layer 103. In the embodiment, a material of the active layer 104 includes indium gallium zinc oxide or indium zinc oxide. The active layer 104 is used as conductive channels.

The doped layer 105 is disposed on the active layer 104. In the embodiment, the doped layer 105 is used to form an ohmic contact to reduce contact resistance.

The second metal layer 106 is disposed on the doped layer 105. The second metal layer 106 is used to form data lines. Further, in the embodiment of the present disclosure, the second metal layer 106 is connected to the peripheral common electrode line 2021 described in the present disclosure, and a specific connecting method is described below.

The passivation layer 107 is disposed on the active layer 104 and covers the active layer 104 and the doped layer 105. In the embodiment, a material of the passivation layer 107 includes at least one of silicon oxide, silicon nitride, or silicon oxynitride. The passivation layer 107 is used to protect metal layers and prevent them from being corroded.

The conductive layer 108 is disposed on the passivation layer 107. In the embodiment of the present disclosure, a material of the conductive layer 108 includes indium tin oxide. The conductive layer 108 achieves a connection to the second metal layer 106 by the first through-hole 1081, and achieves a connection to the first metal layer 102 by the second through-hole 1082. By this, the second metal layer 106 can be connected to the peripheral common electrode line 2021 disposed in the first metal layer 102. Wherein, the first through-hole 1081 penetrates through the passivation layer 107, and the second through-hole 1082 penetrates through the passivation layer 107, the active layer 104, and the gate electrode insulating layer 103 in sequence.

Figure 2:
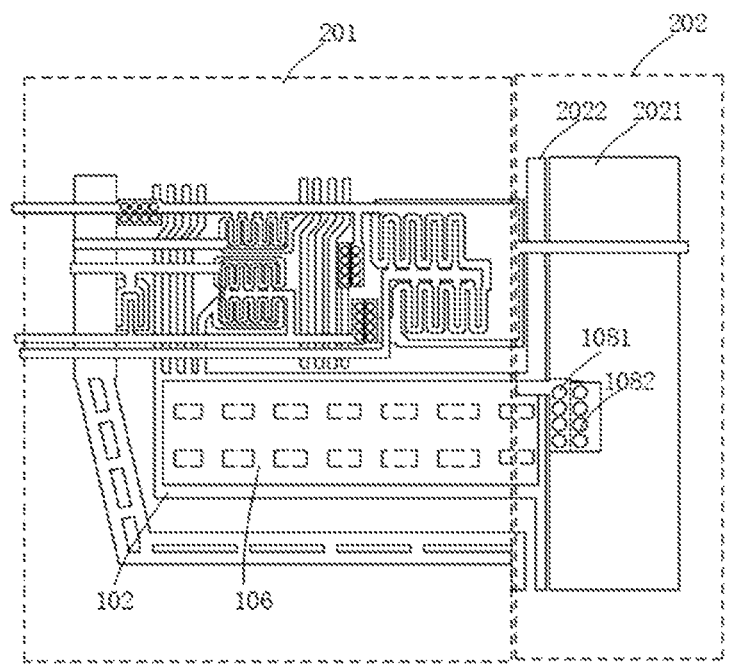
FIG. 2 is a schematic structural diagram of a relationship between a GOA driver circuit of an array substrate and a bus area according to an embodiment of the present disclosure.

As shown in FIG. 2, FIG. 2 is a schematic structural diagram of a relationship between a GOA driver circuit included by the array substrate shown in FIG. 1 and a bus area according to an embodiment of the present disclosure. Wherein, the array substrate includes a display area and a non-display area disposed surrounding the display area. The non-display area includes a GOA driver circuit 201.

The GOA driver circuit 201 is connected to the start pulse signal line 2022 disposed in a bus area 202, and the start pulse signal line 2022 is insulated from the peripheral common electrode line 2021. Wherein, FIG. 2 is a cross-sectional view of the array substrate under a top viewing angle.

Combining FIGS. 1 and 2, the peripheral common electrode line 2021 and the start pulse signal line 2022 are both disposed in the first metal layer 102.

Specifically, the peripheral common electrode line 2021 is connected to the conductive layer 108 through the second through-hole 1082. The conductive layer 108 is connected to the second metal layer 106 through the first through-hole 1081, thereby having the peripheral common electrode line 2021 to be connected to the second metal layer 106.

Since a projection of the start pulse signal line 2022 on the array substrate at least partially overlaps a projection of the second metal layer 106 on the array substrate, a capacitor between the second metal layer 106 and the start pulse signal line 2021 can be formed, and the capacitor is used to release electric charges accumulated in the GOA driver circuit.

In the embodiment of the present disclosure, the start pulse signal line 2022 is a first plate (or called a lower plate) of the capacitor, the second metal layer 106 is a second plate (or called an upper plate) of the capacitor, and the gate electrode insulating layer 103 disposed on the first metal layer 102 is a dielectric insulating layer of the capacitor.

According to principles of capacitors, it can be known that under a top viewing angle, the more the projections of the second metal layer 106 and the first metal layer 102 where the start pulse signal line 2022 is located on the array substrate overlap (that is, the larger an area where the upper plate and the lower plate are directly opposite to each other is), the greater a capacitance of the capacitor is. Similarly, the lesser a thickness of the dielectric insulating layer in the capacitor, that is, the lesser a distance between the upper plate and the lower plate, the greater the capacitance of the capacitor is.

Therefore, by reasonably setting an overlapping portion of the second metal layer 106 which is connected to the peripheral common electrode line 2021 and acts as the second plate and the first metal layer 102 which forms the start pulse signal line 2022 and acts as the first plate, a distance between the second metal layer 106 and the first metal layer 102, and the thickness of the gate electrode insulating layer 103 between the second metal layer 106 and the first metal layer 102, the capacitor which meets demands can be obtained, thereby increasing a discharging rate of the electric charges by the capacitor, and achieving electrostatic protection.

Figure 3:
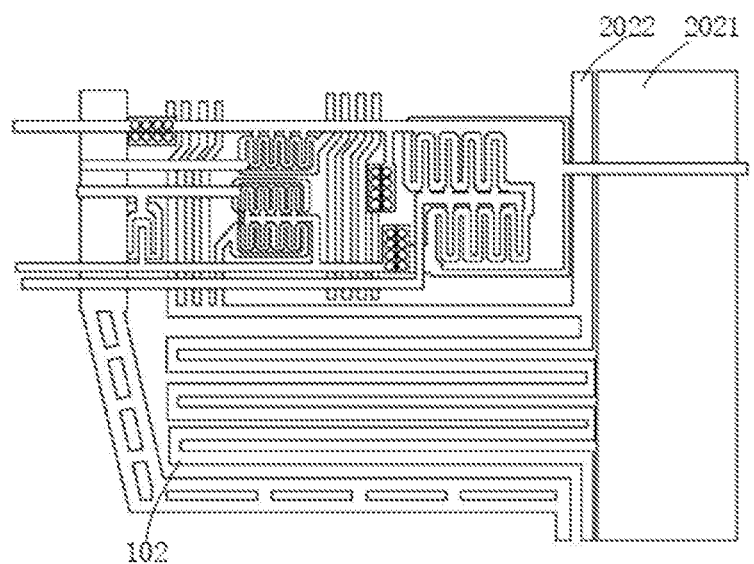
FIG. 3 is a schematic structural diagram of a relationship between a GOA driver circuit and a bus area in current technology.

In addition, in the embodiment of the present disclosure, the first metal layer 102 is a patterned metal layer having a grid shape under the top viewing angle. Preferably, the grid shape has equal intervals, as shown in FIG. 2. Compared to a wire-wound design of a start pulse signal line 2022 shown in FIG. 3, in the embodiment of the present disclosure, by designing the start pulse signal line 2022 from the original wire-wound type to the grid shape, current conductive channels of the start pulse signal line 2022 can be increased, and the accumulated electric charges accumulated in the start pulse signal line 2022 can be effectively eliminated, which plays a role of dispersing the electric charges, thereby reducing probability of electrostatic discharge in the start pulse signal line 2022. That is, the first metal layer acting as the lower plate of the capacitor uses the start pulse signal line which is changed from the original wire-wound design to the grid-shaped design, so the directly opposite area of the capacitor is increased, thereby increasing the capacitance of the capacitor. In this way, it is helpful to eliminate the static electricity.

Figure 4:
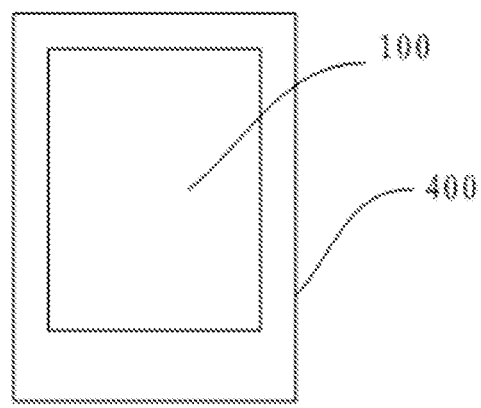
FIG. 4 is a schematic diagram of a display panel according to an embodiment of the present disclosure.

In addition, as shown in FIG. 4, the present disclosure further provides a display panel 400, which uses the above array substrate 100. The display panel 400 can be applied to display devices, such as liquid crystal TVs, liquid crystal displays, mobile phones, and tablet computers.

The array substrate and the display panel provided by the embodiments of the present disclosure are described in detail above. Specific examples are used herein to explain the principles and implementation of the present disclosure. The descriptions of the above embodiments are only used to help understand the method of the present disclosure and its core ideas; meanwhile, for those skilled in the art, the range of specific implementation and application may be changed according to the ideas of the present disclosure. In summary, the content of the specification should not be construed as causing limitations to the present disclosure.

What is claimed is:

1. An array substrate, comprising a display area and a non-display area disposed surrounding the display area, wherein the non-display area comprises:

a gate driver on array (GOA) driver circuit, a start pulse signal line connected to the GOA driver circuit, and a peripheral common electrode line insulated from the start pulse signal line, wherein the non-display area further comprises a first metal layer used to form the start pulse signal line and the peripheral common electrode line; and a second metal layer connected to the peripheral common electrode line, wherein a projection of the start pulse signal line on the array substrate at least partially overlaps a projection of the second metal layer on the array substrate to form a capacitor between the second metal layer and the start pulse signal line, the capacitor is used to release electric charges accumulated in the GOA driver circuit, the start pulse signal line is a first plate of the capacitor, the second metal layer is a second plate of the capacitor, a gate electrode insulating layer disposed on the first metal layer is a dielectric insulating layer of the capacitor, and the first metal layer is a patterned metal layer having a grid shape under a top viewing angle.

2. The array substrate according to claim 1, wherein the gate electrode insulating layer, an active layer, a passivation layer, and a conductive layer are disposed on the first metal layer in sequence, and the conductive layer is connected to the second metal layer through a first through-hole defined on the array substrate and penetrating through the passivation layer.

3. The array substrate according to claim 2, wherein the conductive layer is connected to the first metal layer forming the peripheral common electrode line through a second through-hole defined on the array substrate and penetrating through the passivation layer, the active layer, and the gate electrode insulating layer in sequence.

4. The array substrate according to claim 2, wherein a material of the conductive layer is indium tin oxide.

5. The array substrate according to claim 2, wherein a doped layer is disposed between the active layer and the second metal layer.

6. The array substrate according to claim 1, wherein the grid shape has equal intervals.

7. The array substrate according to claim 1, being an amorphous silicon array substrate or an indium gallium zinc oxide array substrate.

8. An array substrate, comprising a display area and a non-display area disposed surrounding the display area, wherein the non-display area comprises:

a gate driver on array (GOA) driver circuit, a start pulse signal line connected to the GOA driver circuit, and a peripheral common electrode line insulated from the start pulse signal line, wherein the non-display area further comprises a first metal layer used to form the start pulse signal line and the peripheral common electrode line; and a second metal layer connected to the peripheral common electrode line, wherein a projection of the start pulse signal line on the array substrate at least partially overlaps a projection of the second metal layer on the array substrate to form a capacitor between the second metal layer and the start pulse signal line, and the capacitor is used to release electric charges accumulated in the GOA driver circuit.

9. The array substrate according to claim 8, wherein the start pulse signal line is a first plate of the capacitor, the second metal layer is a second plate of the capacitor, and a gate electrode insulating layer disposed on the first metal layer is a dielectric insulating layer of the capacitor.

10. The array substrate according to claim 8, wherein a gate electrode insulating layer, an active layer, a passivation layer, and a conductive layer are disposed on the first metal layer in sequence, and the conductive layer is connected to the second metal layer through a first through-hole defined on the array substrate and penetrating through the passivation layer.

11. The array substrate according to claim 10, wherein the conductive layer is connected to the first metal layer forming the peripheral common electrode line through a second through-hole defined on the array substrate and penetrating through the passivation layer, the active layer, and the gate electrode insulating layer in sequence.

12. The array substrate according to claim 10, wherein a material of the conductive layer is indium tin oxide.

13. The array substrate according to claim 10, wherein a doped layer is disposed between the active layer and the second metal layer.

14. The array substrate according to claim 8, wherein the first metal layer is a patterned metal layer having a grid shape under a top viewing angle.

15. The array substrate according to claim 14, wherein the grid shape has equal intervals.

16. The array substrate according to claim 8, being an amorphous silicon array substrate or an indium gallium zinc oxide array substrate.

17. A display panel, comprising the array substrate according to claim 8.

* * * * *